United States Patent [19]

de Brebisson et al.

[11] 4,160,989
[45] Jul. 10, 1979

[54] INTEGRATED CIRCUIT HAVING COMPLEMENTARY BIPOLAR TRANSISTORS

[75] Inventors: Michel de Brebisson, Caen; Jean-Michel Decrouen, Argences, both of France; Wolfgang F. J. Edlinger, Eindhoven, Netherlands; Jean-Pierre H. Biet, Bieville-Beuville, France

[73] Assignee: U.S. Philips Corporation, New York, N.Y.

[21] Appl. No.: 887,646

[22] Filed: Mar. 17, 1978

Related U.S. Application Data

[63] Continuation of Ser. No. 753,271, Dec. 22, 1976, abandoned.

[30] Foreign Application Priority Data

Dec. 29, 1975 [FR] France .............................. 75 39964

[51] Int. Cl.² .......................................... H01L 27/02

[52] U.S. Cl. ......................................... 357/44; 357/46; 357/52; 357/55; 357/59; 357/92

[58] Field of Search ....................... 357/46, 44, 52, 55, 357/59, 92

[56] References Cited

U.S. PATENT DOCUMENTS

| 3,977,019 | 8/1976 | Matsushita et al. | 357/46 |
| 3,978,515 | 8/1976 | Evans et al. | 357/46 |

*Primary Examiner*—Edward J. Wojciechowicz
*Attorney, Agent, or Firm*—Thomas A. Briody; Edward J. Connors, Jr.; James J. Cannon, Jr.

[57] ABSTRACT

An integrated circuit having one vertical and one lateral bipolar transistor, including a semiconductor substrate, a deposited semiconductor layer, and connection tracks consisting of portions of the semiconductor layer over a dielectric, other portions of the semiconductor layer being used to form contacts for certain active zones of the transistors.

5 Claims, 10 Drawing Figures

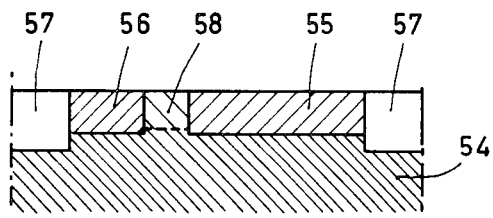
Fig. 4a
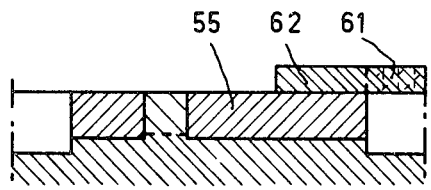
Fig. 4b1
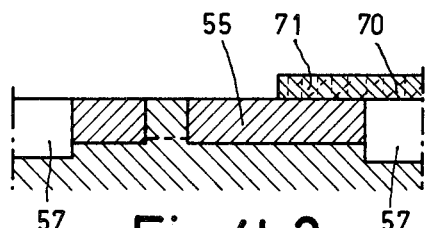
Fig. 4b2
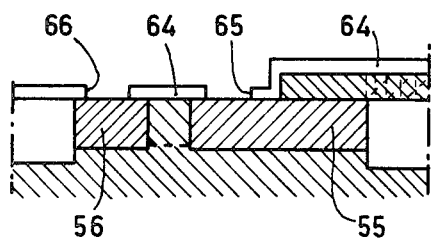
Fig. 4c1
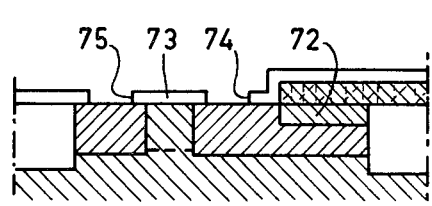
Fig. 4c2
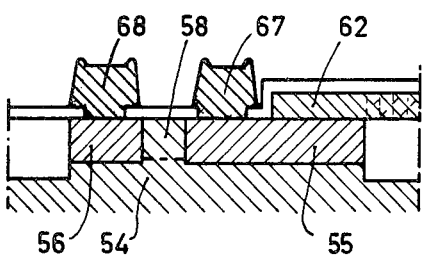
Fig. 4d1
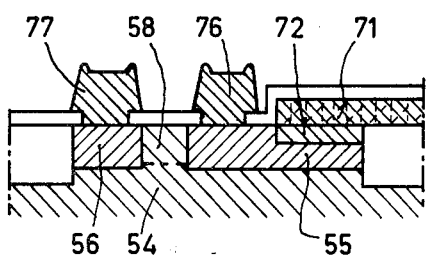
Fig. 4d2

INTEGRATED CIRCUIT HAVING COMPLEMENTARY BIPOLAR TRANSISTORS

This is a continuation of application Ser. No. 753,271, filed Dec. 22, 1976, now abandoned.

The present invention relates to an integrated circuit comprising a semiconductor body having a substrate region of a first conductivity type which supports a number of local regions of the second conductivity type which is opposite to the first, which local regions have substantially the same thicknesses, domains of insulating material being present which adjoin the local regions, and a semiconductor layer configuration of the first conductivity type being present, the integrated circuit comprising at least a first bipolar vertical transistor having three zones in which a first of the zones belongs to the substrate region and a second of the zones which forms the base of the first transistor belongs to one of the local regions, and in which the semiconductor layer configuration extends partly over the insulating domains to form connection tracks and partly over the local region to which the base of the first transistor belongs.

The present invention relates in addition to a method of manufacturing such an integrated circuit.

Integrated circuits having bipolar transistors are products which nowadays are frequently used in several fields of electronics and there exist a large number of variations.

A particularly important field of application of the invention relates to the circuit arrangements of the family of the products which are termed "integrated injection logic" and which are also known by the abbreviation "I²L," which abbreviation will hereinafter be used to indicate the products. A detailed description of the "I²L" circuits can be found, for example, in published French patent application No. 2,138,905.

This type of integrated circuits comprises usually bipolar transistors having a vertical structure which in general have several surface collectors and in which the base regions are coupled to the collector zones of the complementary transistors which provide an adjusting current.

The methods generally used for the manufacture of "I²L" devices have so far been substantially the same as those which serve to manufacture families of bipolar logic integrated circuit according to earlier techniques, for example, the logic with transistors and resistors which is known by the abbreviation "T²L" (or "TTL"), which is derived from the English expression "transistor-transistor logic."

These methods comprise in particular the combination of steps such as: the growth or deposition from the vapour phase of an insulating protecting layer on the surface of a semiconductor body which generally is of silicon, the provision of apertures in the layer by photo-etching, the local diffusion of impurities, the growth of epitaxial layers, ion implantation, and the connection of several elements of the circuit by means of vapour-deposited metal layers which have been converted into a network of connections by photoetching, in which the network may be provided at a single level or also at several levels if the complicated character of the circuit necessitates this.

One of the main reasons for using substantially the same methods as for the conventional bipolar devices is that in this manner it is possible to integrate peripheral parts of the electronic circuit in the same semiconductor body, which parts consist of elements of the earlier families. As a result of this the input and/or output signals of the circuit may be compatible with those of other circuits of the earlier families.

However, by using such conventional methods for the manufacture of circuits of the "I²L" type which are just designed with a view to the compatibility with other families, a number of drawbacks arise: the number of manufacturing steps is high, for example ten, and often even a larger number of different photo-etching masks are necessary for the manufacture of the device.

It is easy to understand that the manufacturing efficiency of an integrated circuit is influenced considerably by the number of operations necessary for its manufacture. This is the more emphasized because complex integrated circuits or so-called LSI-circuits are concerned, that is complex circuits having a very large number of elements in which the circuits each occupy a comparatively large area of the semiconductor body. The possibility of causing an error which is destructive for the operation of the circuit actually increases rapidly with the number of operations and with the area occupied by the circuit.

From this it follows that the development of integrated circuits having bipolar transistors with an ever increasing complexity is inhibited by technical and economical restrictions which are related to too low manufacturing efficiencies.

Although the object of the introduction of the logic "I²L" technique has been especially the improvement of this situation and in particular the further shifting of the complexity limit of the integrated circuits having bipolar transistors, the fact remains that the use of the conventional structures of integrated circuits which necessitate methods including a large number of steps involves a practical and economical limitation on large scale integration of even more complex functions.

Although one may have recourse to the mutual connection of the elements of the circuit with a network at different levels, which, due to the resulting wiring facilities, usually permits of a certain reduction of the area occupied by circuit, the potential gain of the manufacturing efficiency which might result herefrom is substantially compensated by the addition of extra steps to the method, which steps are particularly delicate because they contribute to the augmentation of the relief of the surface of the circuit, which relief involves an increased risk of defects as a result of interruptions of the metal track, for example on the edge of the inclinations.

It is the object of the invention to mitigate the said drawbacks. These drawbacks which are cited with reference to the logical circuits of the "I²L" type, are characteristic of all integrated circuits having bipolar transistors so that, although the invention may be applied in particular to circuit arrangements of the "I²L" type, it also relates to all circuits having bipolar transistors of the kind described in the preamble.

It is an object of the present invention to improve such integrated circuits so that they show a structure which permits of a facilitated manufacture.

The invention is based inter alia on the recognition that this can be achieved by a particular use of a deposited semiconductor layer.

According to the invention, an integrated circuit comprising a semiconductor body having a substrate region of a first conductivity type which supports a number of local regions of the second conductivity type which is opposite to the first, which local regions have substantially the same thicknesses, domains of insulating material being present which adjoin the local regions, and a semiconductor layer configuration of the first conductivity type being present, the integrated circuit comprising at least a first bipolar vertical transistor having three zones in which a first of the zones belongs to the substrate region and a second of the zones which forms the base of the first transistor belongs to one of the local regions, and in which the semiconductor layer configuration extends partly over the insulating domains to form connection tracks and partly over the local region to which the base of the first transistor belongs, is characterized in that a part of the semiconductor layer configuration which is situated on the local region to which the base zone of the first transistor belongs is mainly monocrystalline and forms a third zone of the first transistor.

It is of advantage to deposit the semiconductor layer in such circumstances that the growth occurs mainly monocrystalline on the surface parts which are not occupied by the insulating domains so that after providing the configuration the monocrystalline third zone or third zones of the first transistor(s) and polycrystalline conductor tracks which are elements of the first interconnection level are simultaneously obtained. The tracks are then connected to a complementary interconnection network via suitable apertures in an insulating layer which separates the network from the polycrystalline conductor tracks.

The circuit arrangement according to the invention presents the advantage that the structure thereof is suitable to be manufactured according to a simplified method with a small number of steps, which method itself forms part of the present invention. The wiring facilities coupled to double layer interconnection, for example, are obtained substantially by means of the invention by the processes which normally result in a circuit having a single interconnection level. Because the number of manufacturing steps has been reduced, the tolerances between the elements may also be reduced and a more compact circuit be obtained: From this it follows in particular that the manufacturing efficiency of an integrated circuit according to the invention is higher and its cost-price is lower. The danger of incorporating manufacturing defects has been minimized, for which reason the invention serves as a base for the manufacture of more complex monolithic integrated circuits, that is to say with a larger number of elements and this in favourable economical conditions.

An integrated circuit according to the invention has the additional advantage that the third zone of the first transistor has a connection which is more reliable and can be obtained in a simple manner.

An important embodiment of the invention is characterized in that two adjacent regions of the local regions forms the emitter and collector zones of a second horizontal bipolar transistor, in which the first and the second transistor are complementary to each other and in which the emitter and collector zones are separated from each other by a region of the first conductivity type which forms the base of the second transistor, and in which the part of the substrate region which supports the emitter and collector zones extends up to the zones and has an impurity doping concentration which is larger than that of the region of the first conductivity type.

Another favorable embodiment of the invention is characterized in that the local regions of the second conductivity type are bounded laterally at least partly by a band of insulating material which forms at least a part of the domains of insulating material and which extends in the depth up to the substrate region, the conductor track which belongs to the semiconductor layer configuration extending mainly over the insulating band.

By using the invention in this form one benefits not only by the advantages which are inherent in said isolation technique but also by a great simplification during the manufacture of the circuit.

The invention will be described in greater detail with reference to the accompanying Figures.

Figure 1:
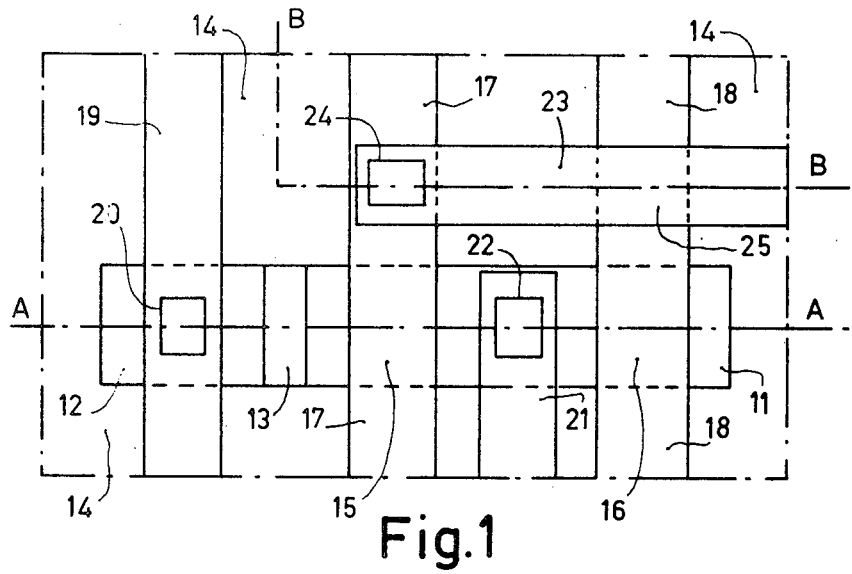
FIG. 1 is a plan view of a part of an integrated circuit according to the invention.
Figure 2:
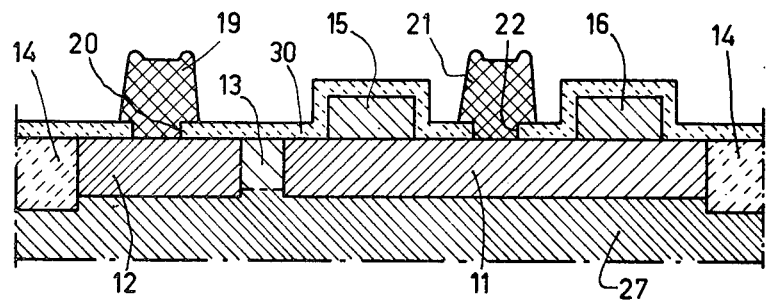
FIG. 2 is a diagrammatic sectional view of the same part of the integrated circuit taken on the line AA of FIG. 1.

FIGS. 4a to 4d1 show diagrammatically the principal steps of a method of manufacturing an integrated circuit according to the invention and FIGS. 4b2 to 4d2 illustrate a modification of the method, FIG. 1 relates to an integrated circuit of the "I$^2$L" type a part of which is shown in plan view. In this example the semiconductor substrate is monocrystalline silicon of the n-type having a high concentration of doping impurities. In the proximity of the active or major surface, the semiconductor body has a number of local regions of substantially the same thickness the conductivity type of which is opposite to that of the substrate, so in this example of the p-type. Two of these local regions are denoted by 11 and 12 in FIG. 1.

The local region 11 is isolated electrically from the remainder of the circuit, first of all by the p-n junction which the region 11 forms with the adjoining part of the semiconductor substrate of the n-type which underlies the region 11 and which is not visible in the plane of FIG. 1, secondly by the p-n junction between the region 11 and the n-type region 13 situated beside the region 11, and thirdly by the laterally insulating bands 14 which in this example are of silicon oxide and which extend in the depth down to the substrate region 27. In a corresponding manner the local region 12 is isolated electrically by p-n junctions with the substrate region 27 and the region 13 which are both n-type, and by the insulating bands 14.

A first bipolar npn transistor has a first zone which in this case forms the emitter and which belongs to the substrate region 27 (FIG. 2). The second zone which forms the base of the npn transistor belongs to the local region 11. The transistor has two collectors which are formed by the n-type zones 15 and 16 extending over the local region 11.

According to the invention, the conductor tracks 17 and 18 are parts of a semiconductor layer configuration, in this case a thin layer of n-type silicon, which extends over the domains of insulating material which are formed by the insulating bands 14.

According to the invention, the conductor tracks 17 and 18 continue into the collector zones 15 and 16, respectively, which themselves are also formed by layer portions of the semiconductor layer configuration.

FIG. 1 also shows a second transistor which is complementary to the first transistor, namely a pnp transistor. In this example the emitter of the second transistor is formed by the local region 12. The collector belongs to the local region 11. This region 11 thus is common to the collector of the second transistor and the base zone of the first transistor.

The base zone of the pnp transistor is formed by the region 13 which is situated as a band between the emitter and the collector. The pnp transistor is a so-called lateral transistor.

FIG. 1 also shows part of a complementary connection network, which network is formed by metal tracks of, for example, aluminum, the thickness of which is approximately one micrometer. The track 19 is connected to the local region 12 in the contact aperture 20. The track 21 is connected to the local region 11 in the aperture 22, and the track 23 is connected to the track 17 in the aperture 24. The apertures 20, 22 and 24 are provided in a layer of insulating material which is referenced 30 in FIGS. 2 and 3. In the present example the layer 30 consists of silicon oxide and extends over the surface of the whole wafer or slice below the network of metal tracks, except in the places of the contact apertures. The track 23 crosses the semiconductor track 17 without contacting same in the region 25 where the elements are situated one above the other.

FIG. 2 is a diagrammatic sectional view of the part of the integrated circuit of FIG. 1 taken on the line AA. In this example the local regions 11 and 12 are islands which are doped with boron and which have a thickness of approximately 0.6 micrometer. Provided on the n-type silicon substrate is an epitaxial layer of the same conductivity type and of a resistivity in the order of 0.5 to 1 ohm.cm and a thickness which is substantially equal to the thickness of the local regions 11 and 12. What remains of the epitaxial layer after the formation of the local regions 11 and 12 is only the band-like region 13 adjoining the regions. The insulating band 14 is situated around the local regions 11 and 12 and adjoins same except at the area where the region 13 is present. The thickness of the insulating band 14 is larger than that of the regions 11 and 12. An isolation with sunken or inset oxide of this type can be obtained by means of the known method of local oxidation of silicon, according to which method a silicon nitride mask is used against the thermal oxidation, while via apertures in the mask the oxidation is obtained in the areas where this is desired.

According to the invention which presents the advantage that a large number of elementary regions can be formed which have different functions and for which the same number of operations is used, the collector zones 15 and 16 of the npn transistor are each formed in a monocrystalline layer portion of the semiconductor layer configuration, which layer portion is situated on and directly adjoins the region 11.

Outside the parts which form the zones 15 and 16, the semiconductor layer configuration is supported by the thick oxide bands 14 so that due to the manner of providing which will be explained hereinafter the material of the layer is generally polycrystalline at that area.

Visible moreover in FIG. 2 are the metal tracks 19 and 21 at the area where they contact the local regions 12 and 11, respectively, via the apertures 20 and 22 which are provided in the insulating layer 30, the insulating layer in this example being a $0.1\mu$ thick silicon oxide layer.

Figure 3:
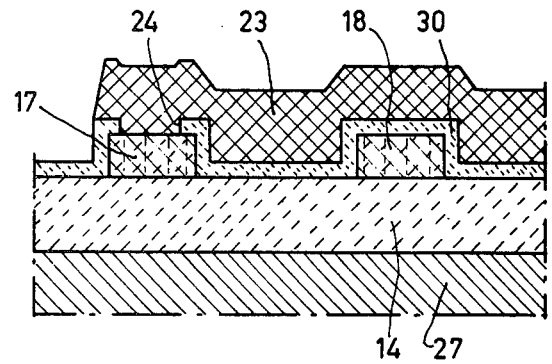
FIG. 3 is a sectional view of another detail of the same part of the integrated circuit according to the invention taken on the line BB of FIG. 1.

FIG. 3 is a sectional view of a part of the circuit arrangement shown in FIG. 1 taken on the line BB. The semiconductor tracks 17 and 18 are supported by the thick oxide band 14 at the level of said section BB. FIG. 3 shows both a contact between a metal track and a semiconductor track and an isolated crossing of connections or cross-over. The insulating layer 30 separates the metal track 23 electrically from the semiconductor track 18 so that an isolated crossing of connections is formed. On the other hand, an aperture 24 is provided in the insulating layer 30 so as to obtain a conductive connection between the metal track 23 and the semiconductor track 17.

It is to be noted that the emitter of the npn transistor can be connected directly to a large number of other emitters of similar npn transistors. This can be realized with the substrate which, for example, may be connected to a reference potential. In the example the base of the pnp transistor is also connected to the potential because the bandlike region 13 is connected directly to the substrate region 27.

It is to be noted that many variations may be applied to the circuit arrangement described without departing from the scope of this invention.

For example, the values of the thickness and of the resistivity of the epitaxial layer may be changed and adapted to the desired electrical properties of the circuit. In addition, the local regions 11 and 12 can be obtained in a manner differing from local doping. The n-type substrate, for example, may be covered with an epitaxial p-type layer instead of with an n-type layer and the region 13 (FIGS. 1 and 2) between the local regions 11 and 12 may then be obtained by means of, for example, ion implantation of an n-type impurity succeeded by annealing under usual conditions. The ion implantation is carried out under such conditions that the epitaxial layer which is of the p-type is converted throughout the depth thereof into the n-type and that the width and the impurity concentration of the region 13 enable the pnp transistor to have a proper gain. Preferably, the impurity concentration of the region 13, at least in certain places, is lower than that of the part of the substrate region 27 adjoining the local regions, so that the injection of the emitter will occur mainly in a lateral direction towards the collector.

The example described has a homogeneous substrate 27, which presents the advantage of simplicity. Alternatively, only the surface parts of the substrate may be of the n-type in which the remainder of the substrate may be of the p-type or in which the surface parts may be isolated by a layer of insulating material. The surface parts of the substrate which then form the substrate region, may be obtained by means of a homogeneous layer, or a double layer- or a multi-layer structure which permits of satisfying particular requirements as regards the operation and performance of the circuit and of applying different reference potentials to components or parts of the circuit.

FIG. 1 shows semiconductor tracks 17 and 18 which continue into the layer portions 15 and 16, respectively, which is a particularly simple embodiment of the invention. Interrupting the tracks and replacing a part thereof by a metal track would be within the scope of this invention. However, the semiconductor layer configuration forms at least a connection track on the insulating domains and at least a third zone of the npn transistor on a local region.

An example of isolated crossing at two connection levels has been described with reference to FIG. 3 in which a semiconductor track is present at the first level. The semiconductor track may be connected, for example, at both ends to a metal track of the complementary network to form an isolated crossing with another metal track of the network.

As regards the means which are used to isolate the local regions 11 and 12, a p-n junction might be used, instead of a thick oxide, to laterally bound the regions. The isolating bands of the n-type which are situated outside local regions are then covered with an insulating layer in the areas occupied by the tracks of the semiconductor layer configuration in such manner that configuration is isolated from the n-type material forming the bands.

The insulating layer 30 shown in FIGS. 2 and 3 may consist, besides as described of silicon oxide, alternatively of a different insulating material, for example silicon nitride or aluminum oxide, or be composed of several successive layers of different insulating materials. The network of metal tracks to connect the elements of the circuit which is complementary to the semiconductor layer configuration, may also consist of a suitable material other than aluminum.

The integrated circuit described has a single level of metal connections and, taking into account the layer configuration, presents integration possibilities for complex functions which are comparable to those which are coupled to the use of interconnections at two levels, no extra operations being necessary to obtain the second level.

However, without departing from the scope of this invention, the integrated circuit may alternatively have several levels of metal tracks so that even more complicated circuits can easily be connected together.

Finally, as regards the transistors described, the invention may of course also be applied if the collector zone of the pnp transistor is not formed in the same local region as the base zone of the npn transistor. Furthermore, the polarities of the transistors need not be so as is indicated in the example and they may be reversed by reversing the conductivity types of all zones of the device. Finally the example described has been chosen among the "I²L" type circuits but the integrated circuit according to the invention more generally is of the type having complementary bipolar transistors.

FIGS. 4a to 4d1 relate to a favourable method of manufacturing an integrated circuit according to the invention.

The preparatory phase of the method according to the invention consists in obtaining a number of local regions of the p-type and domains of insulating material adjoining the regions on or in a substrate of which at least a surface part is of the n-type semiconductor material.

In the first example a slice of n-type silicon having a resistivity of from 8 to $14.10^{-3}$ ohm.cm is covered with an epitaxial layer also of the n-type whose resistivity is between 0.5 and 1 ohm.cm and whose thickness is approximately 0.6 micrometer. In FIG. 4a the surface part of the slice which serves as a substrate region is referenced 54. The local regions 55 and 56 which are of the p-type are simultaneously diffused in the epitaxial layer, a band-shaped region 58 of the original material of the epitaxial n-layer remaining, which region separates the local regions 55 and 56 from each other. The remaining part of the circumference of the regions 55 and 56 adjoins the band 57 of thick oxide which is obtained with the known and already mentioned technique of local oxidation of the silicon. A structure which is analogous to that of FIG. 4a can be obtained, for example, by forming the region 58 by implantation of n-type impurity ions in an epitaxial p-type layer. The local regions 55 and 56 then consist of separate parts of the p-type epitaxial layer.

Finally, the local regions 55 and 56 also may be isolated from the remainder of the circuit by a p-n junction. In that case it is favourable to provide the isolating bands of the n-type in the same manner as the region 58 and simultaneously therewith. In that case the number of operations is comparatively small and the overall number of necessary masks then is only four.

In the latter case, by choosing a sufficiently large width for the isolating bands, the gain of the parasitic horizontal pnp transistor which is formed between two local regions which should be isolated from each other may be small as compared with the gain of the desired lateral transistor. With all these possibilities of manufacturing the device according to the invention the local regions are exposed at least partly, the zones or regions adjoining the regions being formed from or being covered with a layer of insulating material.

In the method according to the invention, a thin silicon layer of the n-type is deposited on the whole surface of the body and, for example, has a resistivity in the order of 2 to $4.10^{-2}$ ohm.cm and a thickness of 0.5 to 0.8 micrometer. The layer is deposited in such conditions that the growth thereof is mainly monocrystalline on the free semiconductor surface areas. For this purpose the deposition temperature is sufficiently high, for example 1050° C. or more if silane (SiH₄) is used as a silicon source, or 1100° C. or more if trichlorosilane (SiHCl₄) is used. The silicon layer proves to have a polycrystalline or amorphous structure in the areas where the layer is deposited on material having a less organized structure, for example that of silicon oxide.

The deposited layer is subjected to a photo-etching treatment in a manner known in semiconductor technology, the desired configuration remaining.

The configuration comprises on the one hand polycrystalline connection tracks which are supported by thick oxide bands, for example the track 61 in FIG. 4b1, and on the other hand monocrystalline layer portions which are supported by local regions, for example the layer portion 62 which is supported by the local region 55.

In the example, the track 61 and the layer portion 62 adjoin each other. The two elements of the configuration, however, may be spaced apart without thereby departing from the scope of this invention.

A layer of insulating material is then to be provided on the surface of the body, for example, by depositing silicon oxide from the vapour phase, in a thickness in the order of 0.5 to 0.7 micrometer. In addition, instead of the above-mentioned oxide layer, a silicon nitride layer or an oxide nitride double layer may be deposited. Moreover, the layer may be manufactured by thermal oxidation of the silicon layer of the configuration. FIG. 4c1 shows the body in the stage in which the insulating layer 64 has apertures 65 and 66 which are provided by photoetching at the areas where a contact is desired between the complementary connection network and the local regions 55 and 56.

FIG. 4d1 shows a part of the device obtained with five masking operations, the device comprising an integrated circuit of the "I²L" type. The device has a first npn transistor with a surface collector and of which the emitter zone forms part of the surface part 54 of the substrate, while the base zone belongs to the local region 55. The collector consists of the layer portion 62 of the semiconductor layer configuration deposited according to the invention.

A second horizontal pnp transistor is preferably combined with the first transistor and consists of the local region 56 as emitter zone, the band-shaped region 58 as base zone and a part of the local region 55 as collector zone.

The complementary connection network consists of an aluminum layer having a thickness of approximately 1 μm which was subjected to a photoetching treatment. Two tracks of the aluminum network are denoted by 67 and 68 in FIG. 4d1 and they contact the local regions 55 and 56, respectively.

FIGS. 4b2 to 4d2 illustrate the steps of a variation of the method of manufacturing the circuit arrangement according to the invention. Provided on an n-type silicon slice are the local p-type regions and the domains of insulating material which adjoin the p-type regions and which are of the same type as those described with reference to FIG. 4a.

On the entire surface of the slice is deposited a thin silicon layer the properties of which are approximately: resistivity 3 to $5.10^{-4}$ ohm.cm, n-type, thickness 0.3 to 0.5 μm. The layer is deposited at a temperature of 650° C. to 700° C., silane ($SiH_4$) being used as a silicon source. At this comparatively low deposition temperature and taking into account the high concentration of doping impurities in the layer, a layer is formed which has a polycrystalline amorphous structure. The layer is then etched in the desired configuration. FIG. 4b2 shows the semiconductor body in this stage in which a track 70 of the layer configuration extends over a domain of insulating material, for example the thick oxide band 57, and a part 71 of the configuration extends over a part of the local region 55.

A thermal treatment is then carried out, for example, at 1000° C., so that a part of the impurities diffuses from the part 57 into the local region 55 and an n-type region is formed which in FIG. 4c2 is denoted by 72. The duration of the treatment is adjusted so that the depth of the diffusion is approximately 0.4 μm.

An insulating layer 73 is then provided on the surface of the slice and the aperture 74 and 75 necessary for the contacts with the complementary network of metal tracks are provided in the layer.

FIG. 4d2 finally shows the device as it is obtained after providing the aluminum connection network of which the track 76 is connected to the local region 55 and the track 77 is connected to the local region 56.

FIG. 4d2 shows an npn transistor having a surface collector and an emitter zone which belongs to the surface part 54 of the substrate, and a base zone which belongs to the local region 55. The collector zone is formed by the region 72 which underlies and is in direct contact with the layer portion 71.

The structure also comprises a lateral pnp transistor of which the emitter zone is formed by the local region 56, the base zone is formed by the band 58 and the collector zone is formed by a part of the local region 55. For the satisfactory operation of this lateral pnp transistor is of importance that the isolation bands 57 extend up to or into the more highly doped substrate region and the emitter and collector zones are separated from each other laterally by a less highly doped region. The zones 55, 56 and 58 of the transistor thus are situated collectively within a common isolating ring 57.

The invention is not restricted to the embodiments described. Many variations are possible to those skilled in the art without departing from the scope of this invention. For example, instead of silicon other semiconductor materials, for example germanium or $A_{III}B_V$ compounds, may alternatively be used.

What is claimed is:
1. An integrated circuit comprising:
   a semiconductor substrate portion of a first conductivity type;
   a plurality of regions of semiconductor material of a second conductivity type on said substrate portion;
   regions of first insulating material adjoining said semiconductor regions, and extending at least partially thereover;
   a semiconducting layer of first type conductivity extending partially over said regions of insulating material forming a connection track and partially over said semiconductor regions, said semiconducting layer comprising a monocrystalline portion and a polycrystalline portion;
   a first bipolar npn transistor having first, second and third vertically arranged successive zones, said first zone being located in said substrate region, said second zone forming the base of the first transistor and located in one of said second type semiconductor regions, and said third zone located in said monocrystalline portion of said semiconductor layer and located on said one semiconductor region, said second zone separating said third zone from said substrate region.

2. An integrated circuit as defined in claim 1, further comprising:
   a second bipolar pnp transistor comprising two adjacent ones of said regions of semiconductor material with an n-type region therebetween having an impurity doping concentration less than that of said substrate portion; and
   a band of second insulating material at least partially bounding said p-type regions of semiconductor material and extending in depth down to said substrate portion.

3. An integrated circuit as claimed in claim 1, further comprising a network of conductor tracks separated from said semiconductor layer by an insulating layer, a polycrystalline portion of said semiconductor layer being supported entirely by one of said regions of insulating material and being connected in two places to said network of conductor tracks.

4. An integrated circuit as defined in claim 1, wherein said region of second conductivity type on said substrate directly adjoins said semiconductor substrate portion of a first conductivity type.

5. An integrated circuit comprising:
   a semiconductor body having a substrate portion of a first conductivity type;
   a plurality of semiconductor regions of the second conductivity type opposite to the first on said substrate portion, each of said regions having substantially the same thickness;
   first regions of insulating material adjoining said semiconductor regions, and extending at least partially thereover;
   a first bipolar vertical npn transistor having first, second, and third zones, said first zone located in the substrate portion, said second zone forming the base of said transistor and located in one of said semiconductor regions, and said third zone of the first conductivity type located on said one semiconductor region separating said third zone from the substrate portion, second regions of insulating material comprising a band of insulating material bounding at least partially said semiconductor regions of the second conductivity type, a second bipolar pnp transistor comprising two adjacent ones of said regions of semiconductor material with an n-type region therebetween having an impurity doping concentration less than that of said substrate portion;

a semiconductor layer of the first conductivity type extending partially over said insulating regions and forming a connection track, and extending partially over said ones semiconductor region, said base zone of the first transistor being located for forming a contact with said third zone, said band of insulating material extending in depth down to said substrate portion; and a network of conductor tracks separated from said semiconductor layer by an insulating layer, a polycrystalline portion of said semiconductor layer being supported entirely by one of said regions of insulating material and being connected in two places to said network of conductor tracks.

* * * * *